US012609676B2

(12) United States Patent
Jiao

(10) Patent No.: US 12,609,676 B2
(45) Date of Patent: Apr. 21, 2026

(54) FILTER CIRCUIT, FILTER AND COMMUNICATION DEVICE

(71) Applicant: BOE Technology Group Co., Ltd., Beijing (CN)

(72) Inventor: Zhuofan Jiao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 79 days.

(21) Appl. No.: 18/699,646

(22) PCT Filed: Aug. 29, 2023

(86) PCT No.: PCT/CN2023/115578
§ 371 (c)(1),
(2) Date: Apr. 9, 2024

(87) PCT Pub. No.: WO2025/043491
PCT Pub. Date: Mar. 6, 2025

(65) Prior Publication Data
US 2025/0239993 A1 Jul. 24, 2025

(51) Int. Cl.
H03H 9/54 (2006.01)
(52) U.S. Cl.
CPC .................................... H03H 9/542 (2013.01)
(58) Field of Classification Search
CPC ............ H03H 9/542; H03H 7/06; H03H 9/54; H03H 9/568; H03H 9/605
See application file for complete search history.

(56) References Cited

U.S. PATENT DOCUMENTS

| | | | |
|---|---|---|---|
| 2011/0090026 A1 | 4/2011 | Nakahashi et al. | |
| 2011/0199168 A1 | 8/2011 | Kadota | |
| 2016/0344092 A1 | 11/2016 | Ogami | |
| 2018/0198437 A1 | 7/2018 | Mori | |
| 2019/0036508 A1 | 1/2019 | Tsukamoto et al. | |
| 2019/0081613 A1* | 3/2019 | Nosaka .................... | H03H 9/64 |
| 2019/0149130 A1 | 5/2019 | Tani | |
| 2019/0245517 A1 | 8/2019 | Nosaka | |

(Continued)

FOREIGN PATENT DOCUMENTS

| | | |
|---|---|---|
| CN | 106031035 A | 10/2016 |
| CN | 108028641 A | 5/2018 |
| CN | 108886349 A | 11/2018 |

(Continued)

*Primary Examiner* — John W Poos
(74) *Attorney, Agent, or Firm* — WHDA, LLP

(57) ABSTRACT

A filter circuit, a filter and a communication device relate to the technical field of communication. The filter circuit includes a series branch connected between the first port and the second port and including a series resonance circuit and a series impedance element connected in series with each other, wherein the series resonance circuit includes a series resonator; and a parallel branch connected between a parallel node and a ground potential and including a parallel resonance circuit and a parallel impedance element connected in series with each other, wherein the parallel resonance circuit includes a parallel resonator, and the parallel node is located on a connection path of the first port and the second port; wherein the resonance frequency of the series resonator is less than the resonance frequency of the parallel resonator.

19 Claims, 11 Drawing Sheets

(56)        References Cited

U.S. PATENT DOCUMENTS

| | | | |
|---|---|---|---|
| 2019/0326884 A1 | 10/2019 | Nosaka | |
| 2019/0341910 A1* | 11/2019 | Pang | H03H 9/64 |

FOREIGN PATENT DOCUMENTS

| | | |
|---|---|---|
| CN | 109196777 A | 1/2019 |
| CN | 109478879 A | 3/2019 |
| CN | 109643984 A | 4/2019 |
| CN | 111342806 A | 6/2020 |
| CN | 111817687 A | 10/2020 |
| CN | 114421925 A | 4/2022 |
| CN | 116346069 A | 6/2023 |

* cited by examiner

FILTER CIRCUIT, FILTER AND COMMUNICATION DEVICE

TECHNICAL FIELD

The present disclosure relates to the technical field of communication and more particularly, to a filter circuit, a filter, and a communication device.

BACKGROUND

With the development of communication technology, the demand for spectrum utilization efficiency is higher and higher, and then the transmission band spacing between different information is smaller and smaller in the process of information transmission. This requires a band-stop filter to filter out the noise spectrum or the spectrum without the transmitted signal by the transmitted signal in a specific frequency range to meet the requirements of information transmission.

SUMMARY

The present disclosure provides a filter circuit including:
a series branch connected between a first port and a second port, and including a series resonance circuit and a series impedance element connected in series with each other, wherein the series resonance circuit includes a series resonator; and
a parallel branch connected between a parallel node and a ground potential, and including a parallel resonance circuit and a parallel impedance element connected in series with each other, wherein the parallel resonance circuit includes a parallel resonator; and the parallel node is located on a connection path of the first port and the second port;
wherein a resonance frequency of the series resonator is less than a resonance frequency of the parallel resonator.

In some embodiments, the series resonance circuit includes a plurality of series resonators connected in series with each other; and the series resonators are connected between the series impedance element and the first port and/or between the series impedance element and the second port.

In some embodiments, the resonance frequencies of the plurality of series resonators are the same.

In some embodiments, the parallel resonance circuit includes a plurality of parallel resonators connected in parallel with each other; and the plurality of parallel resonators are connected between the parallel impedance element and the parallel node or between the parallel impedance element and the ground potential.

In some embodiments, the resonance frequencies of the plurality of parallel resonators are the same.

In some embodiments, the filter circuit includes a plurality of the parallel branches, and the resonance frequencies of the parallel resonators in the plurality of the parallel branches are all the same.

In some embodiments, the plurality of the parallel branches include a first parallel branch and a second parallel branch, a parallel node connected to the first parallel branch is a first parallel node, and a parallel node connected to the second parallel branch is a second parallel node;
wherein the series resonator and/or the series impedance element are connected between the first parallel node and the second parallel node.

In some embodiments, the parallel impedance element in the first parallel branch and the parallel impedance element in the second parallel branch are capacitors with different capacitance values or inductors with different inductance values.

In some embodiments, the filter circuit further includes:
a voltage dividing impedance element connected in parallel with at least one series resonator, or connected in parallel with the at least one series resonator and the series impedance element.

In some embodiments, the voltage dividing impedance element and the series impedance element are both inductors, and an inductance value of the voltage dividing impedance element is greater than an inductance value of the series impedance element; or
the voltage dividing impedance element and the series impedance element are both capacitors, and a capacitance value of the voltage dividing impedance element is greater than a capacitance value of the series impedance element.

In some embodiments, the difference between the resonance frequency of the parallel resonator and the resonance frequency of the series resonator is greater than or equal to 0.1 GHz and less than or equal to 0.3 GHz.

In some embodiments, the parallel resonator and the series resonator are elastic wave resonators of the same type, and the types of the elastic wave resonators include a surface acoustic wave resonator and a bulk acoustic wave resonator.

In some embodiments, the series impedance element includes at least one of an adjustable capacitor, an adjustable inductor, a non-adjustable capacitor, and a non-adjustable inductor; and
the parallel impedance element includes at least one of an adjustable capacitor, an adjustable inductor, a non-adjustable capacitor, and a non-adjustable inductor.

In some embodiments, the series impedance element includes an inductor having an inductance value greater than or equal to 0.5 nH and less than or equal to 3.5 nH.

In some embodiments, the parallel impedance element includes a capacitor having a capacitance value greater than or equal to 0.5 pF and less than or equal to 7 pF.

The present disclosure provides a filter, including one or more filter circuits described as any one of the above embodiments.

In some embodiments, a plurality of the filter circuits include a first filter circuit and a second filter circuit, and a second port of the first filter circuit is connected to a first port of the second filter circuit;
wherein a parallel node connected to a parallel branch in the first filter circuit is a third parallel node, a parallel node connected to a parallel branch in the second filter circuit is a fourth parallel node, and the series resonator and/or the series impedance element are connected between the third parallel node and the fourth parallel node.

In some embodiments, the resonance frequency of the series resonator in the first filter circuit and the resonance frequency of the series resonator in the second filter circuit are the same, and the resonance frequency of the parallel resonator in the first filter circuit and the resonance frequency of the parallel resonator in the second filter circuit are the same.

In some embodiments, the resonance frequency of the series resonator in the first filter circuit is greater than the resonance frequency of the series resonator in the second filter circuit; or the resonance frequency of the series resonator in the first filter circuit is less than the resonance frequency of the series resonator in the second filter circuit.

The present disclosure provides a communication device, including the filter described as any one of the above embodiments.

The above description is only an overview of the technical solution of the present disclosure. In order to have a clearer understanding of the technical means of the present disclosure, it can be implemented according to the content of the specification. In order to make the above and other purposes, features, and advantages of the present disclosure more obvious and easier to understand, the specific implementation methods of the present disclosure are listed below.

BRIEF DESCRIPTION OF THE DRAWINGS

In order to provide a clearer explanation of the technical solutions in the embodiments of the present disclosure or related technologies, a brief introduction will be given below to the accompanying drawings required in the embodiments or related technical descriptions. It is obvious that the accompanying drawings in the following description are some embodiments of the present disclosure. For those skilled in the art, other accompanying drawings can be obtained based on these drawings without creative labor. It should be noted that the proportions in the accompanying drawings are only for illustrative purposes and do not represent the actual proportions.

DETAILED DESCRIPTION

In order to clarify the purpose, technical solution, and advantages of the embodiments of the present disclosure, the following will provide a clear and complete description of the technical solution in the embodiments of the present disclosure in conjunction with the accompanying drawings. Obviously, the described embodiments are a part of the embodiments of the present disclosure, not all of them. Based on the embodiments in the present disclosure, all other embodiments obtained by persons skilled in the art without creative labor fall within the scope of protection of the present disclosure.

The band-stop filter refers to a filter that can pass most frequency components, but attenuate some range of frequency components to a very low level. As opposed to the concept of band-pass filter, the notching filter is a special band-stop filter with very small range of stop band and high quality factor.

Figure 1:
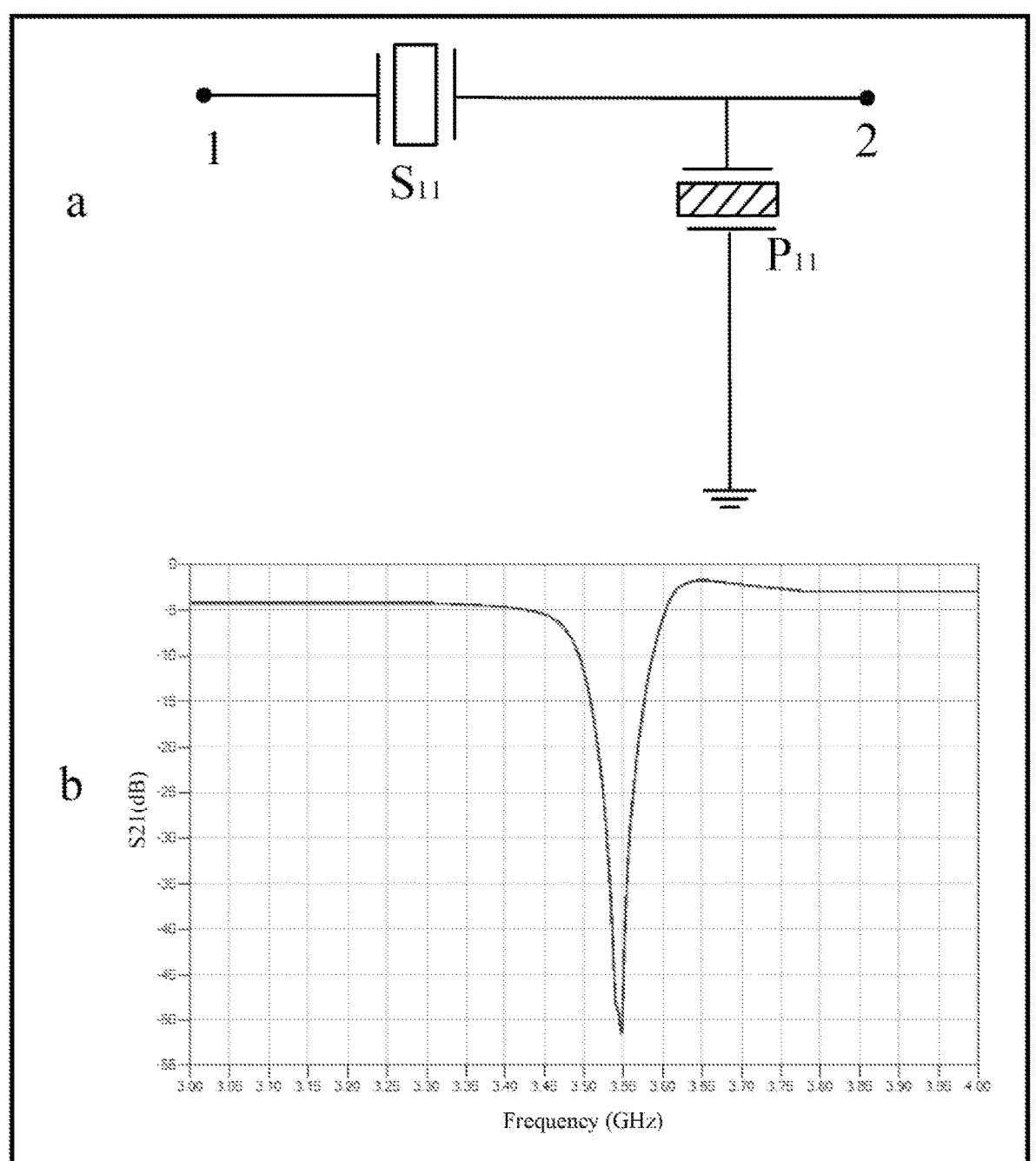
FIG. 1 shows a schematic structural diagram and an S-parameter diagram of a filter circuit in the related art.

In the related art, the band-stop filter circuit is shown in Panel a of FIG. 1. The band-stop filter circuit includes a first port 1, a second port 2, a series resonator $S_{11}$ connected between the first port 1 and the second port 2, and a parallel resonator $P_{11}$ with one end connected to ground and one end connected between the series resonator $S_{11}$ and the second port 2. Panel b in FIG. 1 shows an S-parameter diagram of a band-stop filter shown in Panel a. It can be seen that there is a narrow stop band around 3.55 GHz, the transmission coefficient S21 is about −5 dB within the pass band, the insertion loss is large, the transition band between the pass band and the stop band is wide, and the roll-off coefficient is poor.

In order to solve the above-mentioned problem, the present disclosure provides a filter circuit, as shown in Panel a of any one of FIGS. 2 to 7, and the filter circuit includes: a series branch 21 connected between the first port 1 and the second port 2 and including a series resonance circuit 22 and a series impedance element 23 connected in series with each other, wherein the series resonance circuit 22 includes a series resonator S; and a parallel branch 24 connected between a parallel node N and a ground potential GND and including a parallel resonance circuit 25 and a parallel impedance element 26 connected in series with each other, wherein the parallel resonance circuit 25 includes a parallel resonator P, and the parallel node N is located on a connection path of the first port 1 and the second port 2. Among them, the resonance frequency of the series resonator S is less than the resonance frequency of the parallel resonator P.

As shown in any one of FIGS. 2 to 7, Panel b shows an S-parameter diagram of the filter circuit shown in Panel a. Among them, the frequency range corresponding to the concave waveform is the stop band, and the pass band is located in a frequency range other than the stop band. It can be seen that the transmission coefficient S21 corresponding to the pass band is close to 0 dB. The insertion loss of the pass band is lower. The transition band between the pass band and the stop band is narrower, the roll-off coefficient is better, and two groups of radio frequency signals with a relatively small distance can be separated.

The filter circuit provided by the present disclosure is a deep-notch filter. By providing the series impedance element 23 in the series branch 21 and providing the parallel impedance element 26 in the parallel branch 24, and further by rationally setting the parameters of the series impedance element 23 and the parallel impedance element 26, the passband insertion loss may be reduced and the roll-off coefficient may be optimized.

In a specific implementation, an optimized S-parameter diagram may be obtained by adjusting the parameters of the series resonator S, the parallel resonator P, the series impedance element 23 and the parallel impedance element 26.

For example, the series resonance circuit 22 may be located between the series impedance element 23 and the first port 1 (as shown in FIGS. 2-7), and also may be located between the series impedance element 23 and the second port 2. The series resonance circuit 22 may be provided both between the series impedance element 23 and the first port 1 and between the series impedance element 23 and the second port 2, which is not limited by the present disclosure.

For example, the parallel resonance circuit 25 may be located between the parallel impedance element 26 and the parallel node N (as shown in FIGS. 2-7), may be located between the parallel impedance element 26 and the ground potential GND, and may be provided both between the parallel impedance element 26 and the parallel node N and between the parallel impedance element 26 and the ground potential GND, which is not limited by the present disclosure.

In the present disclosure, the parallel node N may be any node on the connection path of the first port 1 and the second port 2. For example, the parallel node N may be located between the series resonance circuit 22 and the first port 1, between the series resonance circuit 22 and the series impedance element 23, and between the series impedance element 23 and the second port 2, as shown in Panel a of any one of FIGS. 2 to 7.

In some embodiments, the series impedance element 23 includes at least one of an adjustable capacitor, an adjustable inductor, a non-adjustable capacitor, and a non-adjustable inductor. When the series impedance element 23 adopts the adjustable capacitor or the adjustable inductor, the position of the stop band may be fine-tuned.

In some embodiments, the parallel impedance element 26 includes at least one of an adjustable capacitor, an adjustable inductor, a non-adjustable capacitor, and a non-adjustable inductor. When the parallel impedance element 26 adopts the adjustable capacitor or the adjustable inductor, the position of the stop band may be fine-tuned.

For example, the series impedance element 23 includes an inductor of which an inductance value may be, for example, greater than or equal to 0.5 nH and less than or equal to 3.5 nH.

For example, the parallel impedance element 26 includes a capacitor of which a capacitance value may be, for example, greater than or equal to 0.5 pF and less than or equal to 7 pF.

Figure 2:
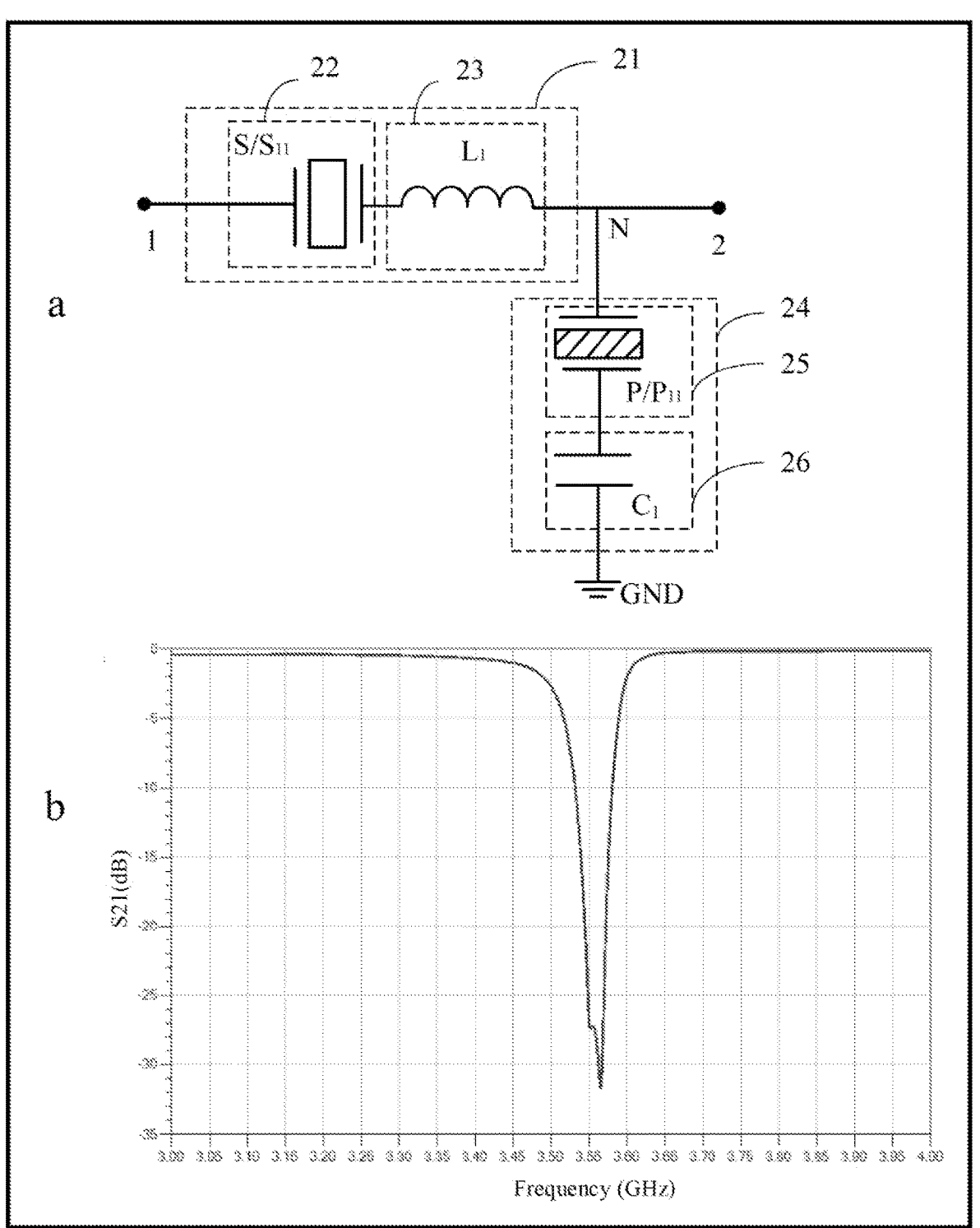
FIG. 2 exemplarily shows a schematic structural diagram and an S-parameter diagram of a first type of a filter circuit according to an embodiment of the present disclosure.
Figure 4:
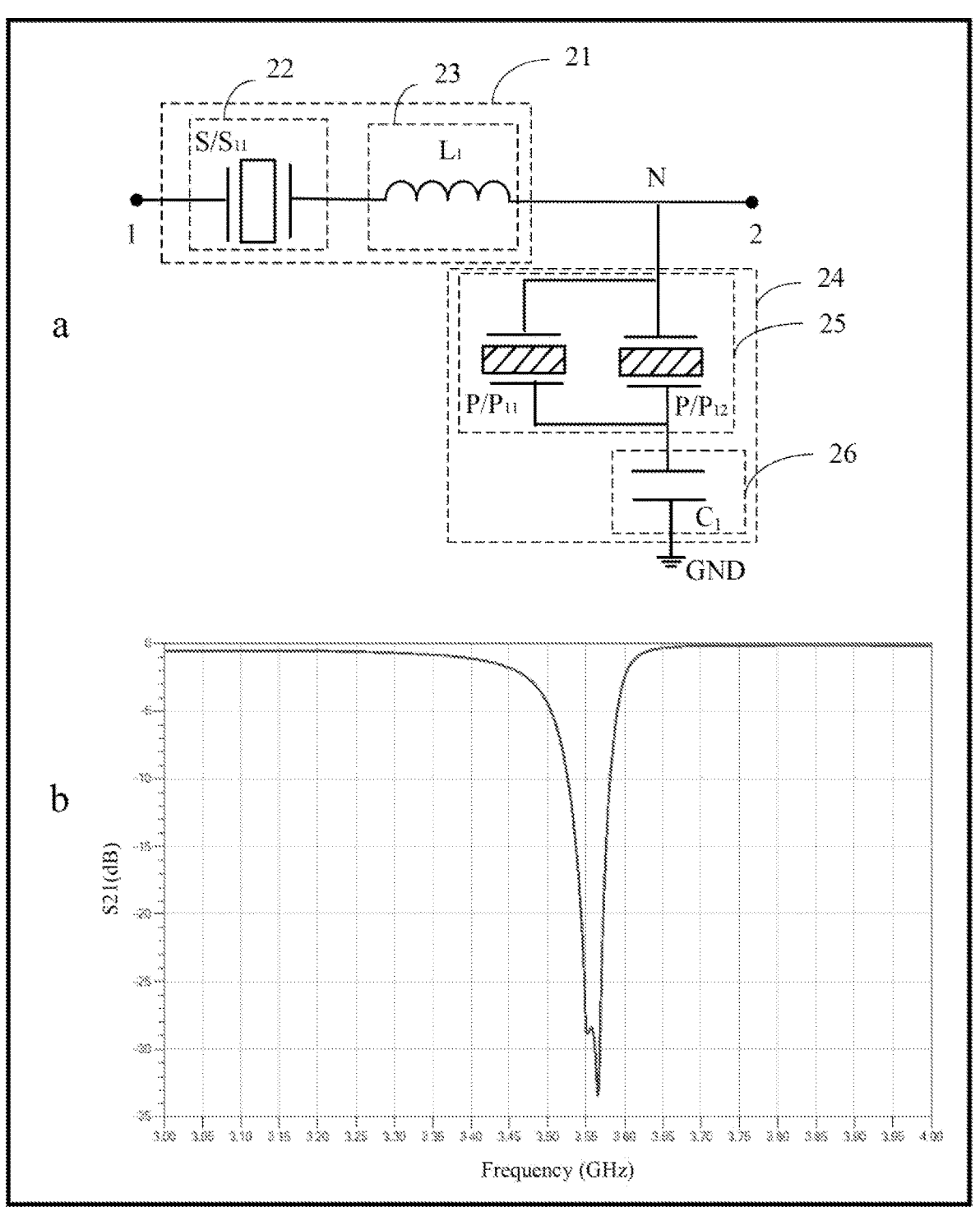
FIG. 4 exemplarily shows a schematic structural diagram and an S-parameter diagram of a third type of a filter circuit according to an embodiment of the present disclosure.

In some embodiments, as shown in Panel a of FIG. 2 or FIG. 4, the series resonance circuit 22 includes a series resonator S.

Figure 3:
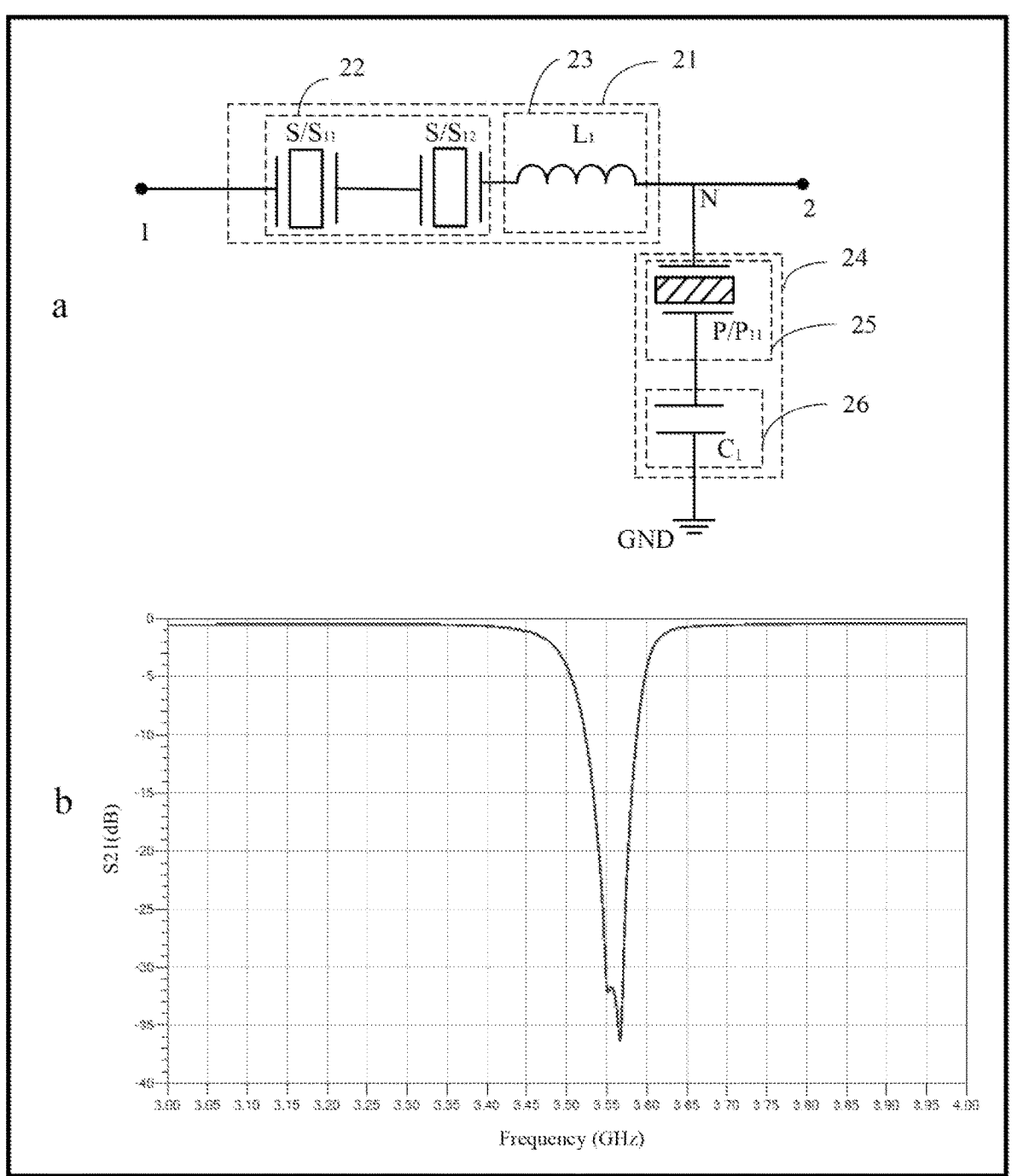
FIG. 3 exemplarily shows a schematic structural diagram and an S-parameter diagram of a second type of a filter circuit according to an embodiment of the present disclosure.
Figure 5:
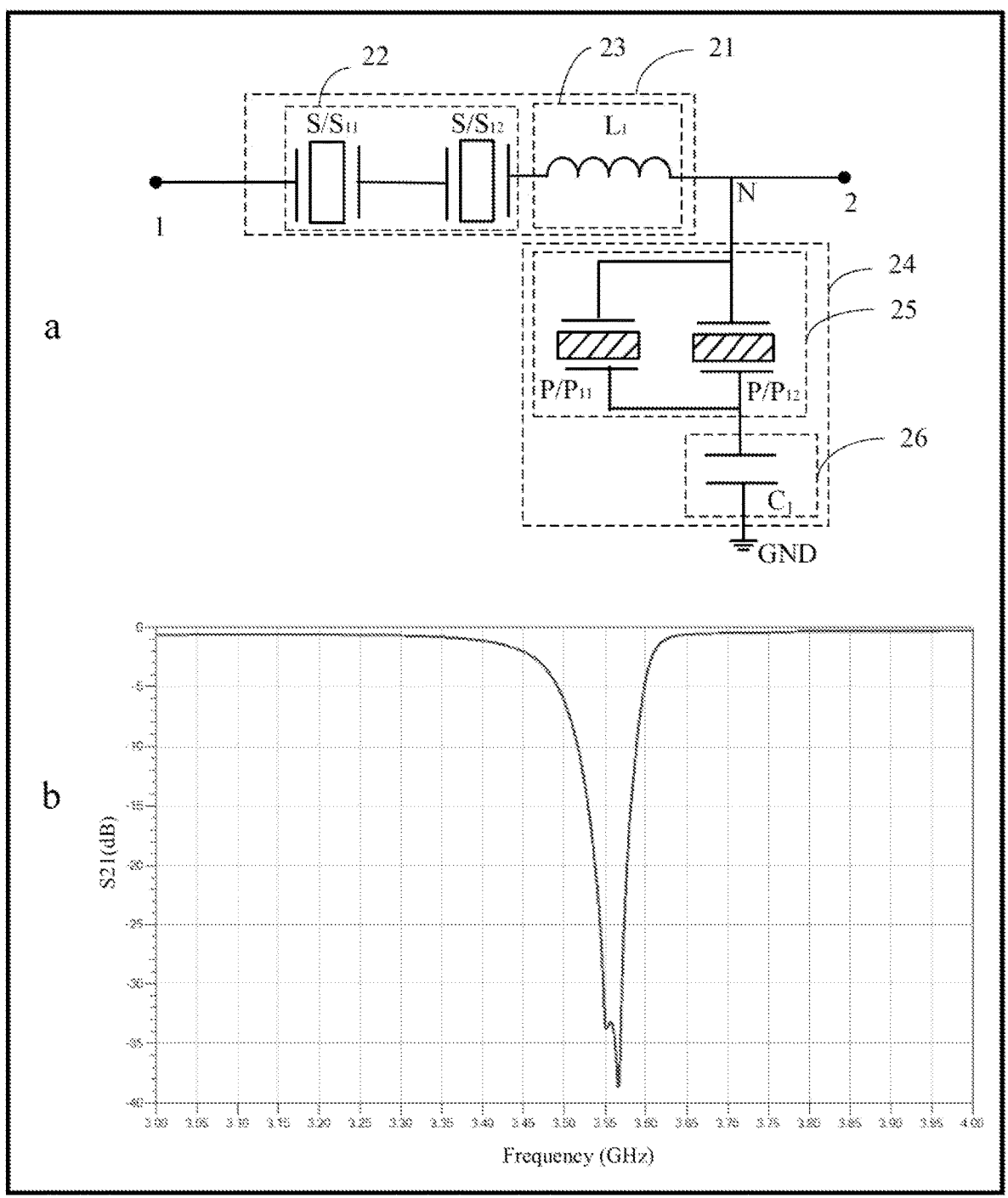
FIG. 5 exemplarily shows a schematic structural diagram and an S-parameter diagram of a fourth type of a filter circuit according to an embodiment of the present disclosure.

In some embodiments, as shown in Panel a of FIG. 3 or FIG. 5, the series resonance circuit 22 includes a plurality of series resonators S connected in series with each other. The series resonators S are connected between the series impedance element 23 and the first port 1 and/or between the series impedance element 23 and the second port 2.

In the present embodiment, the plurality of series resonators S may be located entirely between the series impedance element 23 and the first port 1 (as shown in FIGS. 3 and 5), and also may be located entirely between the series impedance element 23 and the second port 2. A part thereof may be located between the series impedance element 23 and the first port 1, and another part thereof may be located between the series impedance element 23 and the second port 2, which is not limited by the present disclosure.

Among them, when a part of the series resonator S is located between the series impedance element 23 and the first port 1, and another part of the series resonator S is located between the series impedance element 23 and the second port 2, the parallel node N may be located between the series resonator S and the first port 1, between two adjacent series resonators S, between the series resonator S and the series impedance element 23, and between the series resonator S and the second port 2.

In this embodiment, for example, the resonance frequencies of the plurality of series resonators S are the same.

In some embodiments, the parallel resonance circuit 25 includes one parallel resonator P, as shown in Panel a in FIG. 2 or FIG. 3.

In some embodiments, as shown in Panel a of FIG. 4 or FIG. 5, the parallel resonance circuit 25 includes a plurality of parallel resonators P connected in parallel with each other. The plurality of parallel resonators P are connected between the parallel impedance element 26 and the parallel node N, or between the parallel impedance element 26 and the ground potential GND.

In the present embodiment, the plurality of parallel resonators P may be all connected between the parallel impedance element 26 and the parallel node N (as shown in FIGS. 4 and 5), or all connected between the parallel impedance element 26 and the ground potential GND, which is not limited by the present disclosure.

In this embodiment, for example, the resonance frequencies of the plurality of parallel resonators P are the same.

In some embodiments, the filter circuit includes one parallel branch 24, as shown in Panel a of any of FIGS. 2 to 5.

Figure 6:
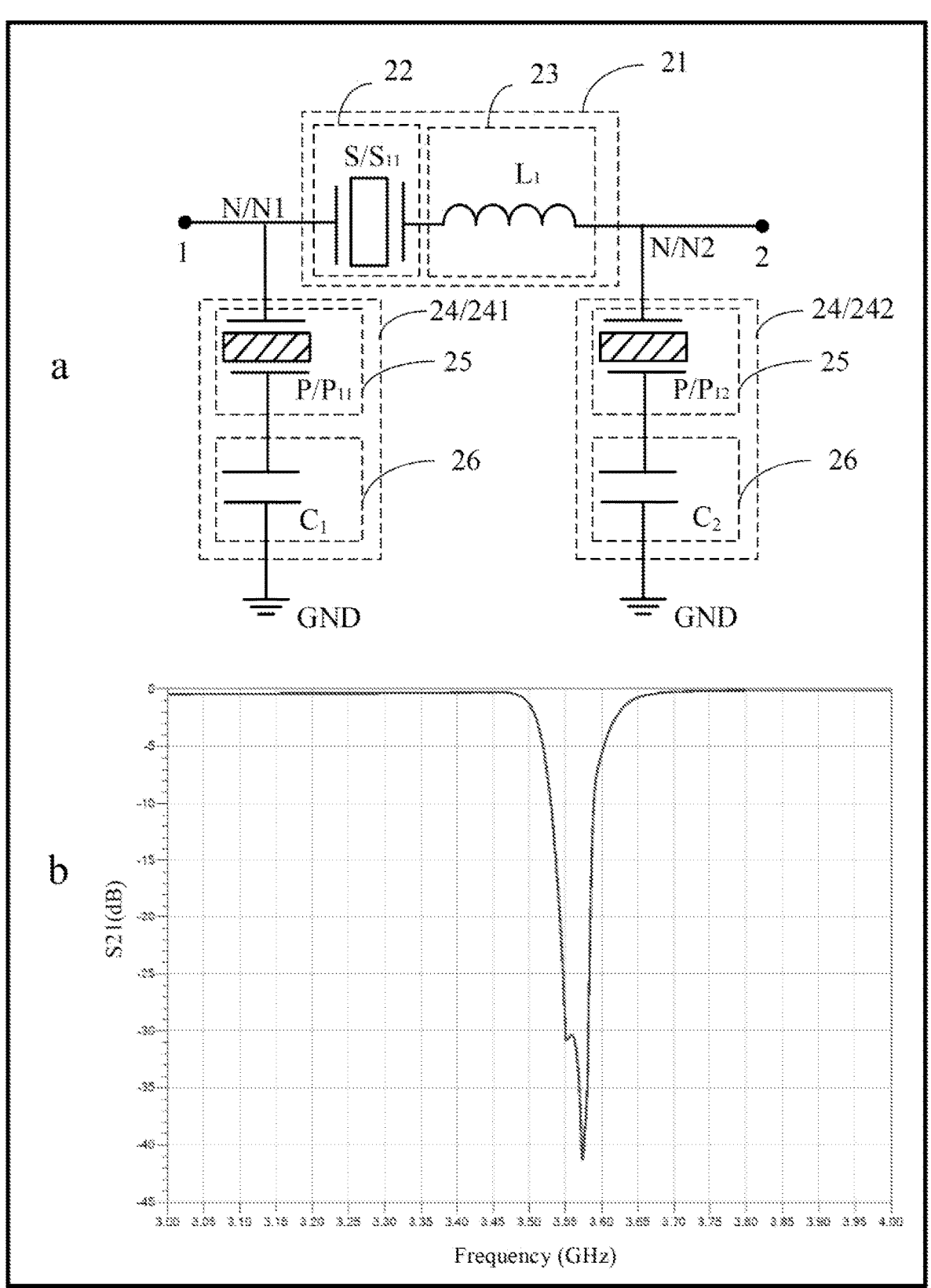
FIG. 6 exemplarily shows a schematic structural diagram and an S-parameter diagram of a fifth type of a filter circuit according to an embodiment of the present disclosure.
Figure 7:
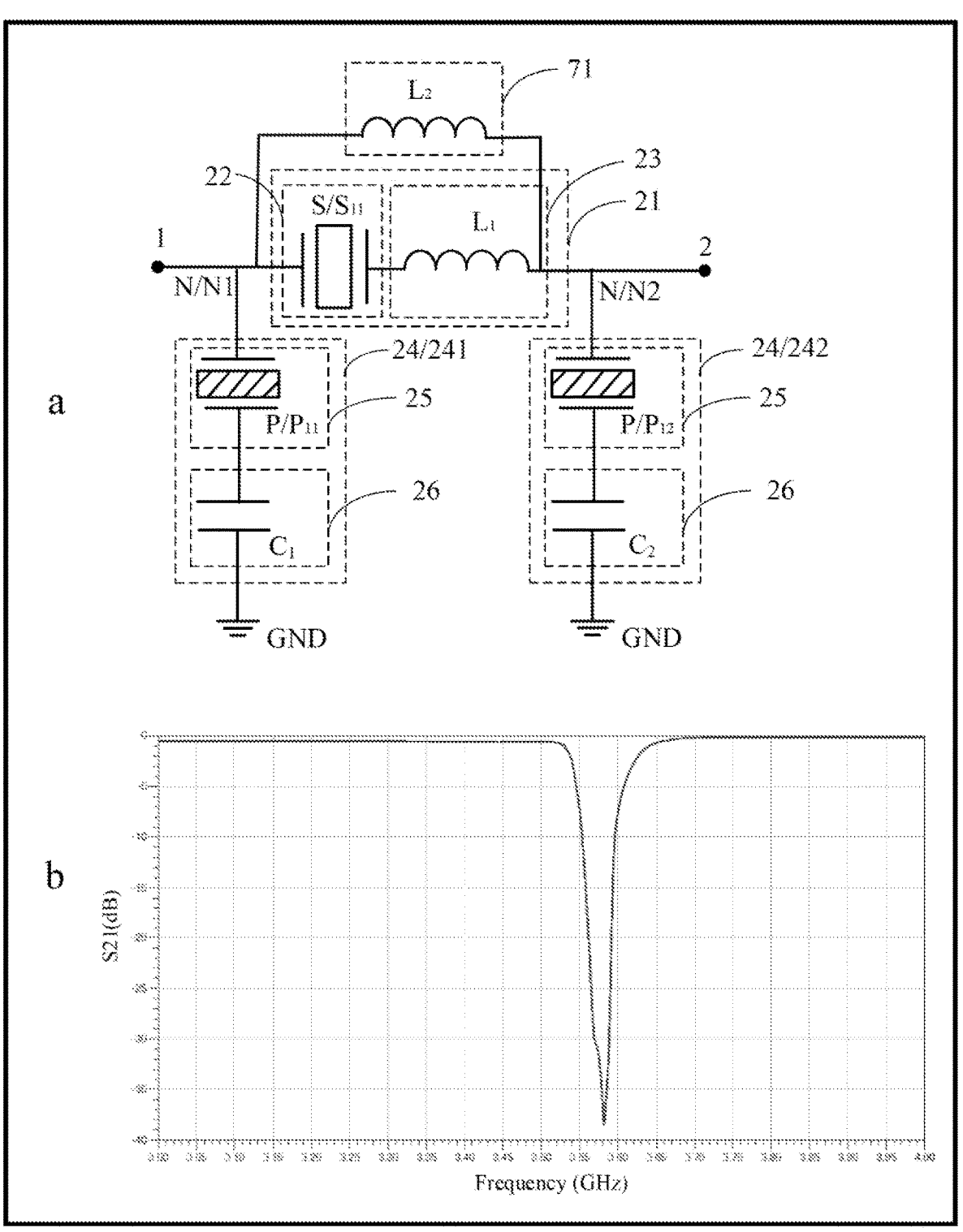
FIG. 7 exemplarily shows a schematic structural diagram and an S-parameter diagram of a sixth type of a filter circuit according to an embodiment of the present disclosure.

In some embodiments, as shown in Panel a of FIG. 6 or 7, the filter circuit includes a plurality of parallel branches 24. The resonance frequencies of the parallel resonators P in the plurality of parallel branches 24 are all the same.

In this embodiment, for example, as shown in Panel a of FIG. 6 or FIG. 7, a plurality of parallel branches 24 includes a first parallel branch 241 and a second parallel branch 242. A parallel node N connected to the first parallel branch 241 is a first parallel node N1, and a parallel node N connected to the second parallel branch 242 is a second parallel node N2. Among them, the series resonator S and/or the series impedance element 23 are connected between the first parallel node N1 and the second parallel node N2.

For example, a series resonator S may be connected between the first parallel node N1 and the second parallel node N2. A series impedance element 23 may be connected between the first parallel node N1 and the second parallel node N2. A series resonator S and a series impedance element 23 may be connected between the first parallel node N1 and the second parallel node N2 (as shown in Panel a of FIG. 6 or in FIG. 7).

For example, the parallel impedance element 26 in the first parallel branch 241 and the parallel impedance element 26 in the second parallel branch 242 are capacitors with different capacitance values, as shown in Panel a of FIG. 6 or FIG. 7. In Panel a of FIG. 6 or FIG. 7, the parallel impedance element 26 in the first parallel branch 241 is a capacitor $C_1$. The parallel impedance element 26 in the second parallel branch 242 is a capacitor $C_2$. The capacitance values of the capacitors $C_1$ and $C_2$ are different. For example, the capacitance value of $C_1$ is less than the capacitance value of $C_2$.

For example, the parallel impedance element 26 in the first parallel branch 241 and the parallel impedance element 26 in the second parallel branch 242 are inductors having different inductance values.

In the specific implementations, the parallel impedance element 26 in the first parallel branch 241 may also be a capacitor, and the parallel impedance element 26 in the second parallel branch 242 may also be an inductor. Alternatively, the parallel impedance element 26 in the first parallel branch 241 is an inductor and the parallel impedance element 26 in the second parallel branch 242 is a capacitor. Which is not limited by the present disclosure.

In some embodiments, as shown in Panel a of FIG. 7, the filter circuit further includes a voltage dividing impedance element 71 connected in parallel with the at least one series resonator S or in parallel with the at least one series resonator S and the series impedance element 23.

For example, the voltage dividing impedance element 71 includes at least one of an adjustable capacitor, an adjustable inductor, a non-adjustable capacitor, and a non-adjustable inductor. When the voltage dividing impedance element 71 adopts an adjustable capacitor or an adjustable inductor, the position of the stop band can be fine-tuned.

For example, as shown in Panel a of FIG. 7, the voltage dividing impedance element 71 and the series impedance element 23 are both inductors. The inductance value of the voltage dividing impedance element 71 is greater than the inductance value of the series impedance element 23. In Panel a of FIG. 7, the series impedance element 23 includes an inductor $L_1$ and the voltage dividing impedance element 71 includes an inductor $L_2$, the inductance value of the inductor $L_2$ is greater than the inductance value of the inductor $L_1$.

For example, the voltage dividing impedance element 71 and the series impedance element 23 are capacitors, and the capacitance value of the voltage dividing impedance element 71 is greater than the capacitance value of the series impedance element 23.

In particular embodiments, the voltage dividing impedance element 71 may also be an inductor, and the series impedance element 23 may be a capacitor. Alternatively, the voltage dividing impedance element 71 is a capacitor and the series impedance element 23 is an inductor. Which is not limited by the present disclosure.

In the specific implementation, since the stop band center is equal to one half of the sum of the resonance frequency of the parallel resonator P and the resonance frequency of the series resonator S. Therefore, the resonance frequency of the parallel resonator P and the resonance frequency of the series resonator S may be adjusted according to practical requirements.

In some embodiments, the difference between the resonance frequency of the parallel resonator P and the resonance frequency of the series resonator S is greater than or equal to 0.1 GHz and less than or equal to 0.3 GHz. Further, the difference between the resonance frequency of the parallel resonator P and the resonance frequency of the series resonator S is greater than or equal to 0.2 GHz and less than or equal to 0.3 GHz. In this way, on the one hand, too narrow a stop band width can be avoided, and on the other hand, the risk of ripples in the stop band may be reduced.

In the specific implementation, the difference between the resonance frequency of the parallel resonator P and the resonance frequency of the series resonator S may be adjusted according to practical requirements such as the stop band width and the S parameter.

In some embodiments, the parallel resonator P and the series resonator S are elastic wave resonators of the same type. The types of elastic wave resonators include a Surface Acoustic Wave (SAW) resonators and a Bulk Acoustic Wave (BAW) resonator.

For example, the parallel resonator P and the series resonator S are both SAW resonators, or the parallel resonator P and the series resonator S are both BAW resonators.

Due to the small size of the elastic wave resonator, both the parallel resonator P and the series resonator S adopt the elastic wave resonator, which may reduce the size of the filter circuit and meet the application requirements of small portable equipment. In addition, it may further improve the quality factor, reduce the insertion loss, improve the spectral suppression effect in the stop band range, reduce the width of the transition band between the pass band and the stop band, and may separate two groups of radio frequency signals with a relatively small distance.

Figure 8:
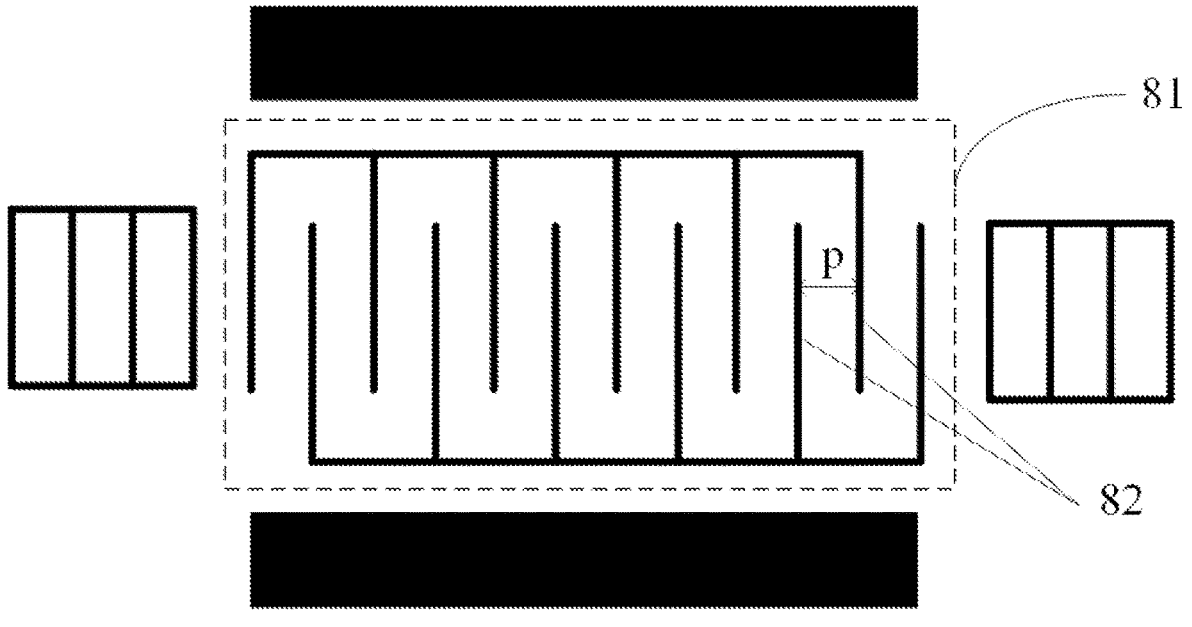
FIG. 8 exemplarily shows a planar structural diagram of a surface acoustic wave resonator.

Referring to FIG. 8, it shows a planar structural diagram of an SAW resonator, the SAW resonator includes an interdigital transducer 81 including two comb electrodes 82 arranged opposite to each other. The working principle of the SAW resonator is to convert an electrical signal into an acoustic wave propagating on the surface of the piezoelectric layer 91 by the interdigital transducer 81. The resonance frequency fp1 of the SAW resonator is determined by a comb pitch p between the comb electrodes 82, i.e., fp1=v1/p, where v1 is the acoustic wave velocity.

Figure 9:
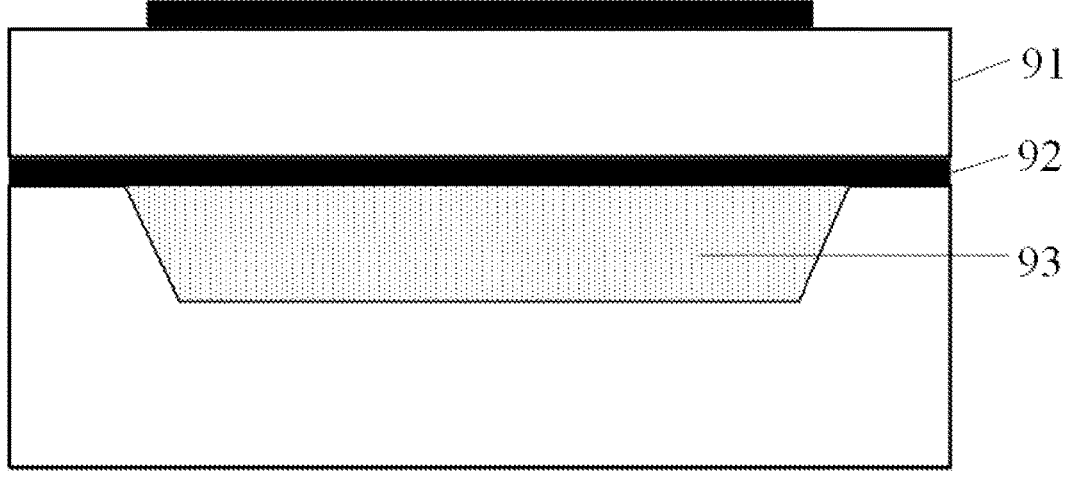
FIG. 9 exemplarily shows a cross-sectional structural diagram of a film bulk acoustic wave resonator.
Figure 10:
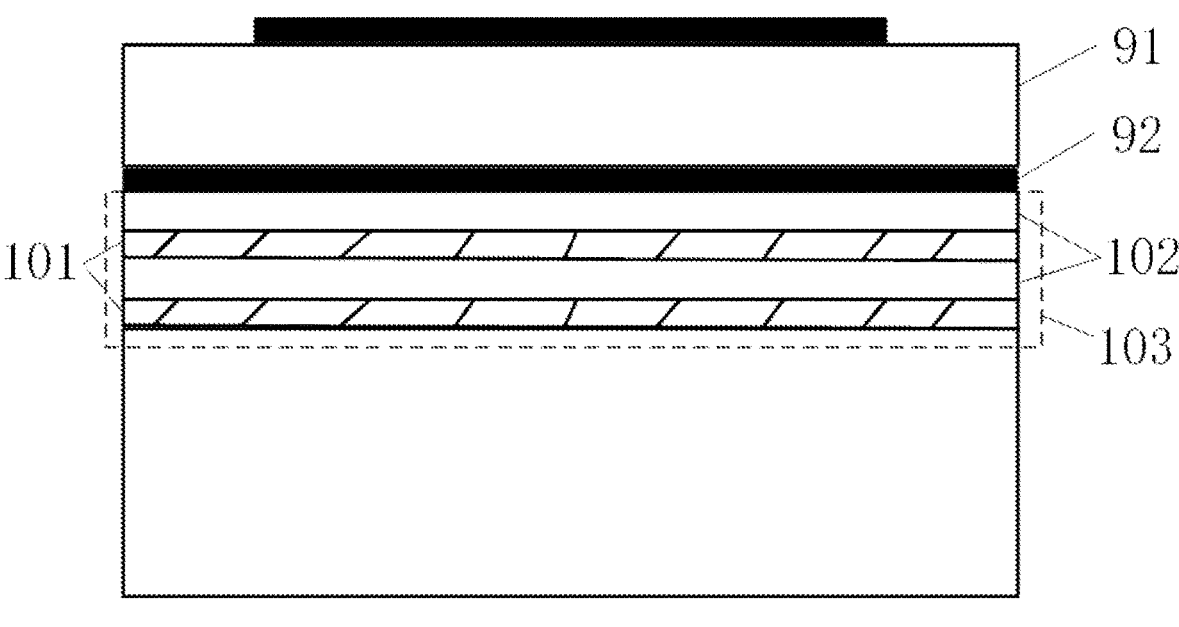
FIG. 10 exemplarily shows a cross-sectional structural diagram of a solidly mounted resonator.

For example, BAW resonators include a film bulk acoustic resonator (FBAR), and a solidly mounted resonator (SMR). Referring to FIG. 9, it shows a cross-sectional structural diagram of a film bulk acoustic resonator. Referring to FIG. 10, it shows a cross-sectional structural diagram of a solidly mounted resonator. As shown in FIGS. 9 and 10, the working principle of the BAW resonator is to convert an electrical signal into a bulk acoustic wave propagating along a direction of a thickness of the piezoelectric layer 91. The resonance frequency fp2 of the BAW resonator is determined by the thickness of the piezoelectric layer 91, i.e., fp2=v/2t, where t is the thickness of the piezoelectric layer 91 and v is the acoustic wave velocity.

As shown in FIG. 9, because the acoustic impedance of the air is approximately equal to zero, total reflection occurs at the interface of a first bottom electrode 92 of the film bulk acoustic resonator and an air gap 93. As shown in FIG. 10, since a high acoustic impedance layer 101 and a low acoustic impedance layer 102 alternately constitute a Bragg reflection layer 103, total reflection occurs at the interface of a second bottom electrode 104 of the solidly mounted resonator and the Bragg reflection layer 103.

The filter circuit provided by the present disclosure is illustrated below.

In a first example, as shown in Panel a of FIG. 2, the filter circuit includes one series branch 21 and one parallel branch 24.

In the series branch 21, a series resonance circuit 22 and a series impedance element 23 are successively connected in series between a first port 1 and a second port 2, the series resonance circuit 22 includes one series resonator $S_{11}$, and the series impedance element 23 includes one inductor $L_1$.

In the parallel branch 24, a parallel resonance circuit 25 and a parallel impedance element 26 are successively connected in series between a parallel node N and a ground potential GND. The parallel node N is located between the inductor $L_1$ and the second port 2. The parallel resonance circuit 25 includes one parallel resonator $P_{11}$, and the parallel impedance element 26 includes one capacitor $C_1$.

Among them, the inductance value of the inductor $L_1$ may be, for example, 0.5 nH-2 nH, and the capacitance value of the capacitor C1 may be 5 pF-6 pF. The parameter settings corresponding to the S parameter shown in Panel b of FIG. 2 are as follows: the resonance frequency of the series resonator $S_{11}$ is 3.44 GHz, the resonance frequency of the parallel resonator $P_{11}$ is 3.55 GHz, and the difference therebetween is 0.11 GHz; the inductance value of the inductor Ly is 1.2 nH, and the capacitance value of the capacitor $C_1$ is 5.7 pF.

In a second example, as shown in Panel a of FIG. 3, the filter circuit includes one series branch 21 and one parallel branch 24.

In the series branch 21, a series resonance circuit 22 and a series impedance element 23 are successively connected in series between a first port 1 and a second port 2. The series resonance circuit 22 includes n series resonators S connected in series with each other, $S_{11}$ to $S1_n$, respectively, where n is a positive integer. In Panel a of FIG. 3, n=2, i.e., the series resonance circuit 22 includes two series resonators S connected in series with each other, $S_{11}$ and $S_{12}$, respectively. The series impedance element 23 includes one inductor $L_1$.

In the parallel branch 24, a parallel resonance circuit 25 and a parallel impedance element 26 are successively connected in series between a parallel node N and a ground potential GND. The parallel node N is located between the inductor $L_1$ and the second port 2. The parallel resonance circuit 25 includes one parallel resonator $P_{11}$ and the parallel impedance element 26 includes one capacitor $C_1$.

Among them, the inductance value of the inductor $L_1$ may be, for example, 0.5 nH-3 nH, and the capacitance value of the capacitor $C_1$ may be between 4 pF-7 pF. The parameters corresponding to the S parameters shown in Panel b of FIG. 3 are set as follows: the resonance frequencies of the series resonators $S_{11}$ and $S_{12}$ are both 3.44 GHz, the resonance frequency of the parallel resonator $P_{11}$ is 3.55 GHz, and the difference therebetween is 0.11 GHz; the inductance value of the inductor $L_1$ is 1.5 nH, and the capacitance value of the capacitor $C_1$ is 5.1 pF.

In a third example, shown in Panel a in FIG. 4, the filter circuit includes one series branch 21 and one parallel branch 24.

In the series branch 21, a series resonance circuit 22 and a series impedance element 23 are successively connected in series between a first port 1 and a second port 2, the series resonance circuit 22 includes one series resonator $S_{11}$, and the series impedance element 23 includes one inductor $L_1$.

In the parallel branch 24, a parallel resonance circuit 25 and a parallel impedance element 26 are successively connected in series between a parallel node N and a ground potential GND. The parallel node N is located between the inductor $L_1$ and the second port 2. The parallel resonance circuit 25 includes m parallel resonators P connected in parallel with each other, $P_{11}$ to $P_{1m}$, respectively, where m is a positive integer. In Panel a of FIG. 4, m=2, i.e., the parallel resonance circuit 25 includes two parallel resonators P connected in parallel with each other, PH and $P_{12}$, respectively. The parallel impedance element 26 includes one capacitor $C_1$.

Among them, the inductance value of the inductor $L_1$ may be, for example, 0.5 nH-3 nH, and the capacitance value of the capacitor $C_1$ may be between 3 pF-6 pF. The parameter settings corresponding to the S parameter shown in Panel b of FIG. 4 are as follows: the resonance frequency of the series resonator $S_{11}$ is 3.44 GHz, the resonance frequencies of the parallel resonators $P_{11}$ and $P_{12}$ are both 3.55 GHz, and the difference therebetween is 0.11 GHz; the inductance value of the inductor $L_1$ is 1.7 nH, and the capacitance value of the capacitor $C_1$ is 4.2 pF.

In a fourth example, as shown in Panel a of FIG. 5, the filter circuit includes one series branch 21 and one parallel branch 24.

In the series branch 21, a series resonance circuit 22 and a series impedance element 23 are successively connected in series between a first port 1 and a second port 2. The series resonance circuit 22 includes n series resonators S connected in series with each other, $S_{11}$ to $S1_n$, respectively, where n is a positive integer. In Panel a of FIG. 5, n=2, i.e., the series resonance circuit 22 includes two series resonators S connected in series with each other, $S_{11}$ and $S_{12}$, respectively. The series impedance element 23 includes one inductor $L_1$.

In the parallel branch 24, a parallel resonance circuit 25 and a parallel impedance element 26 are successively connected in series between a parallel node N and a ground potential GND. The parallel node N is located between the inductor $L_1$ and the second port 2. The parallel resonance circuit 25 includes m parallel resonators P connected in parallel with each other, $P_{11}$ to $P_{1m}$, respectively, where m is a positive integer. In Panel a of FIG. 5, m=2, i.e., the parallel resonance circuit 25 includes two parallel resonators P connected in parallel with each other, $P_{11}$ and $P_{12}$, respectively. The parallel impedance element 26 includes one capacitor $C_1$.

Among them, the inductance value of the inductor $L_1$ may be, for example, 1 nH-3 nH, and the capacitance value of the capacitor $C_1$ may be between 3 pF-6 pF. The parameters corresponding to the S parameters shown in Panel b of FIG. 5 are set as follows: the resonance frequencies of the series resonators $S_{11}$ and $S_{12}$ are both 3.44 GHz, the resonance frequencies of the parallel resonators $P_{11}$ and $P_{12}$ are both 3.55 GHz, and the difference therebetween is 0.11 GHz; the inductance value of the inductor $L_1$ is 2 nH, and the capacitance value of the capacitor $C_1$ is 4 pF.

In a fifth example, as shown in Panel a of FIG. 6, the filter circuit includes one series branch 21 and two parallel branches 24. The two parallel branches 24 are a first parallel branch 241 and a second parallel branch 242 respectively. A parallel node N connected to the first parallel branch 241 is a first parallel node N1, and a parallel node N connected to the second parallel branch 242 is a second parallel node N2.

In the series branch 21, a series resonance circuit 22 and a series impedance element 23 are successively connected in series between a first port 1 and a second port 2, the series resonance circuit 22 includes one series resonator $S_{11}$, and the series impedance element 23 includes one inductor $L_1$.

In the first parallel branch 241, a parallel resonance circuit 25 and a parallel impedance element 26 are successively connected in series between the first parallel node N1 and the ground potential GND. The first parallel node N1 is located between the series resonator $S_{11}$ and the first port 1. The parallel resonance circuit 25 includes one parallel resonator $P_{11}$, and the parallel impedance element 26 includes one capacitor $C_1$.

In the second parallel branch 242, the parallel resonance circuit 25 and the parallel impedance element 26 are successively connected in series between the second parallel node N2 and the ground potential GND. The second parallel node N2 is located between the inductor $L_1$ and the second port 2. The parallel resonance circuit 25 includes one parallel resonator $P_{12}$, and the parallel impedance element 26 includes one capacitor $C_2$.

Among them, the inductance value of the inductor $L_1$ is, for example, 1 nH-3 nH. The capacitance value of the capacitor $C_1$ may be 1.5 pF-4 pF. The capacitance value of the capacitor $C_2$ may be 2 pF-5 pF. The capacitance values of the two capacitors $C_1$ and $C_2$ are different. For example, the capacitance value of $C_1$ is less than the capacitance value of $C_2$. The parameter settings corresponding to the S parameter shown in Panel b of FIG. 6 are as follows: the resonance frequency of the series resonator $S_{11}$ is 3.44 GHz, the resonance frequencies of the parallel resonators $P_{11}$ and $P_{12}$ are both 3.55 GHz, and the difference therebetween is 0.11 GHz; the inductance value of the inductor $L_1$ is 2 nH, the capacitance value of the capacitor $C_1$ is 2.2 pF, and the capacitance value of the capacitor $C_2$ is 3.2 pF.

In a sixth example, as shown in Panel a of FIG. 7, the filter circuit includes one series branch 21 and two parallel branches 24. The two parallel branches 24 are a first parallel branch 241 and a second parallel branch 242 respectively. A parallel node N connected to the first parallel branch 241 is a first parallel node N1, and a parallel node N connected to the second parallel branch 242 is a second parallel node N2.

In the series branch 21, a series resonance circuit 22 and a series impedance element 23 are successively connected in series between a first port 1 and a second port 2, the series resonance circuit 22 includes one series resonator $S_{11}$, and the series impedance element 23 includes one inductor $L_1$.

In the first parallel branch 241, a parallel resonance circuit 25 and a parallel impedance element 26 are successively connected in series between the first parallel node N1 and the ground potential GND. The first parallel node N1 is located between the series resonator $S_{11}$ and the first port 1. The parallel resonance circuit 25 includes one parallel resonator $P_{11}$, and the parallel impedance element 26 includes one capacitor $C_1$.

In the second parallel branch 242, the parallel resonance circuit 25 and the parallel impedance element 26 are successively connected in series between the second parallel node N2 and the ground potential GND. The second parallel node N2 is located between the inductor $L_1$ and the second port 2. The parallel resonance circuit 25 includes one parallel resonator $P_{12}$, and the parallel impedance element 26 includes one capacitor $C_2$.

The filter circuit further includes a voltage dividing impedance element 71 which is connected in parallel with the series resonance circuit 22 and the series impedance element 23, i.e., the voltage dividing impedance element 71 is connected between the first port 1 and the second port 2. The voltage dividing impedance element 71 includes one inductor $L_2$. Among them, the inductance value of the inductor $L_2$ is greater than the inductance value of the inductor $L_1$.

Among them, the inductance value of the inductor $L_1$ may be, for example, 1 nH-3 nH. The inductance value of the inductor $L_2$ is 3 nH-5 nH. The capacitance value of the capacitor $C_1$ is 0.5 pF-2.5 pF. The capacitance value of the capacitor $C_2$ is 1 pF-3 pF. The capacitance values of the two capacitors $C_1$ and $C_2$ are different. For example, the capacitance value of $C_1$ is less than the capacitance value of $C_2$. The parameters corresponding to the S parameters shown in Panel b of FIG. 7 are set as follows: the resonance frequency of the series resonator $S_{11}$ is 3.44 GHz, the resonance frequencies of the parallel resonators $P_{11}$ and $P_{12}$ are both 3.55 GHz, and the difference therebetween is 0.11 GHz; the inductance value of the inductor $L_1$ is 1.9 nH, the inductance value of the inductor $L_2$ is 4 nH, the capacitance value of the capacitor $C_1$ is 1.5 pF, and the capacitance value of the capacitor $C_2$ is 2 pF.

The present disclosure provides a filter including one or more filter circuits as provided in any of the embodiments. It will be appreciated by those skilled in the art that the filter provided by the present disclosure has the advantages of the filter circuit described above.

Figure 11:
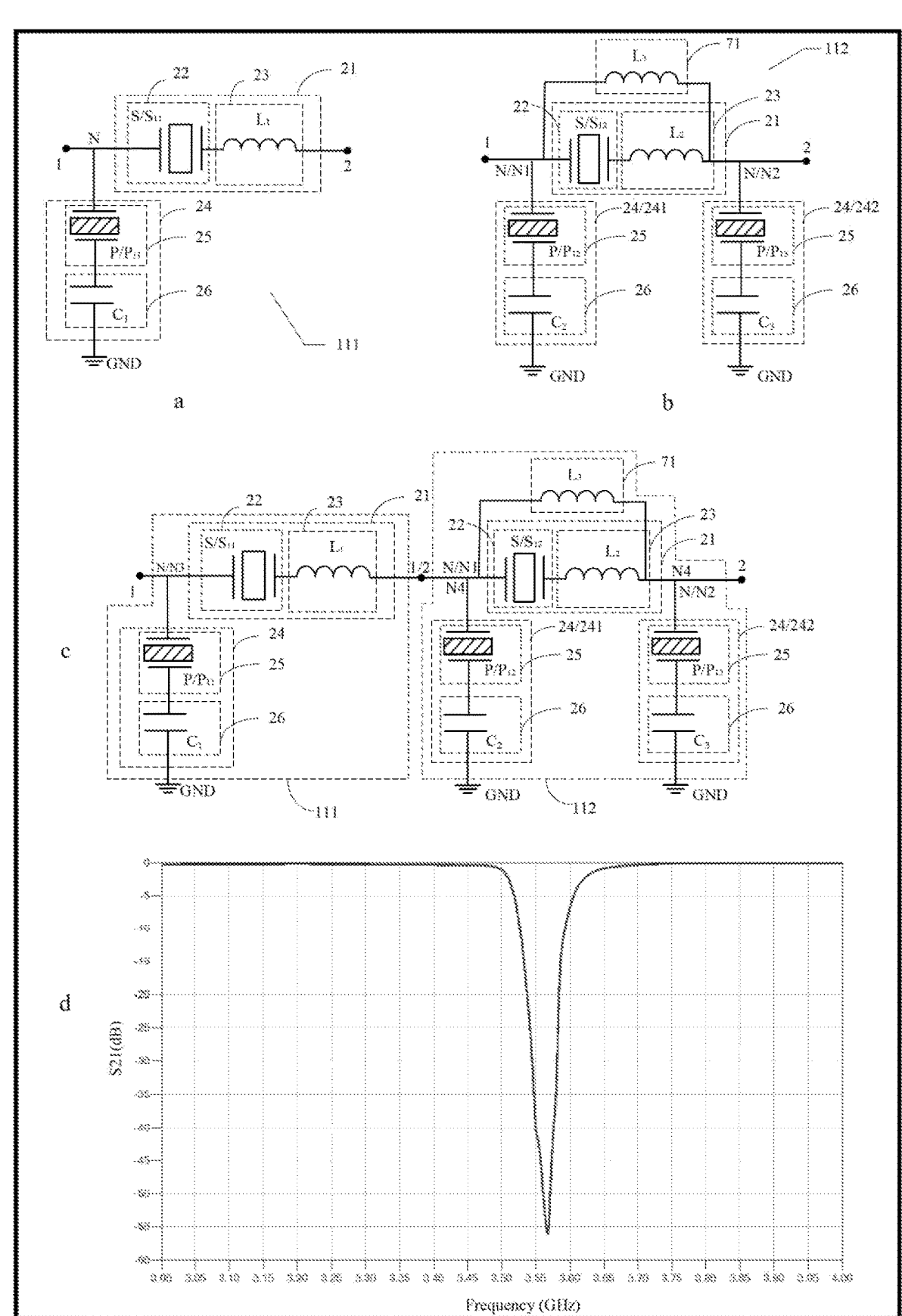
FIG. 11 exemplarily shows a schematic structural diagram and an S-parameter diagram of a first type of a filter according to an embodiment of the present disclosure.
Figure 12:
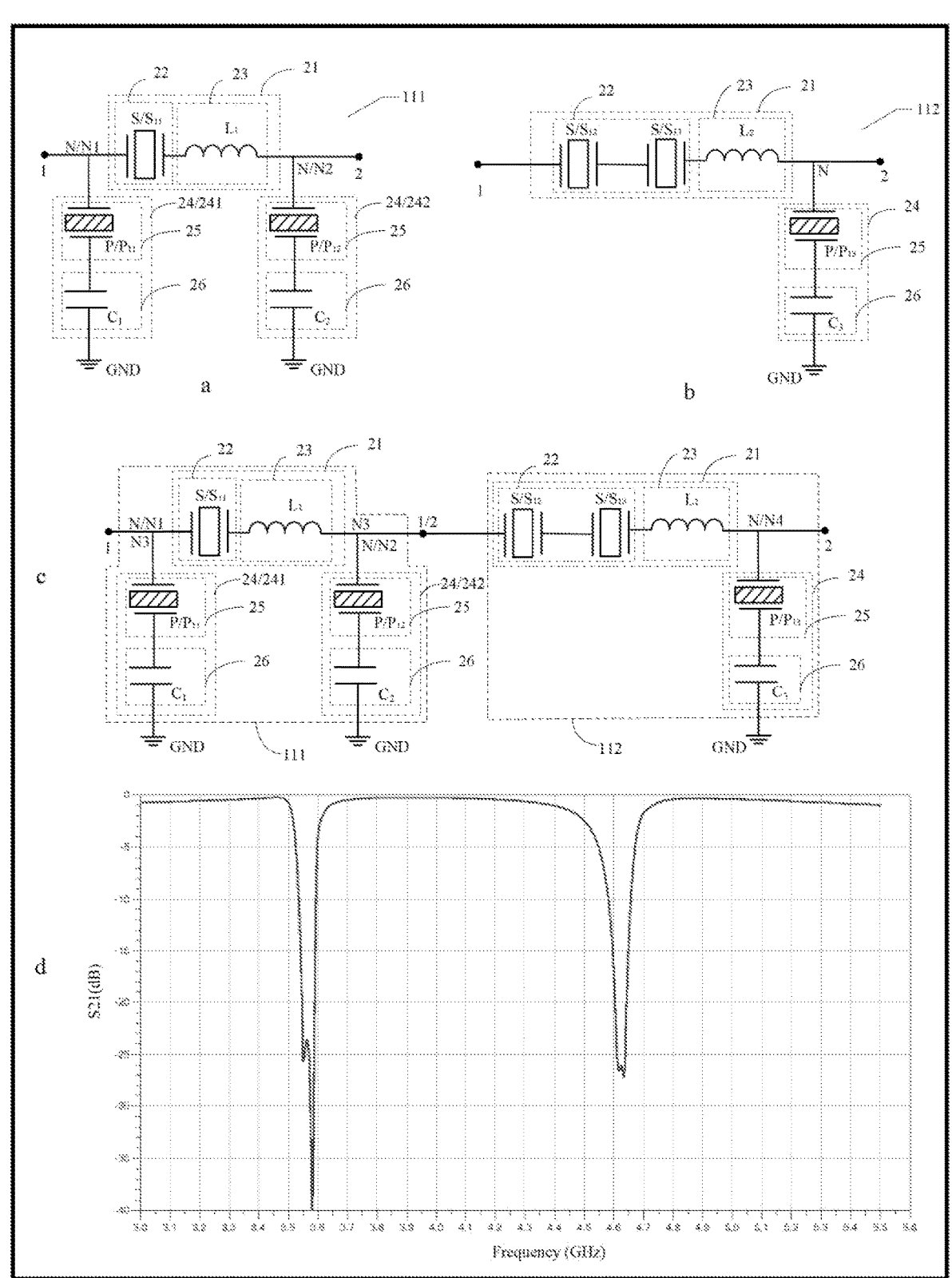
FIG. 12 exemplarily shows a schematic structural diagram and an S-parameter diagram of a second type of a filter according to an embodiment of the present disclosure.

In some embodiments, as shown in Panel c of FIG. 11 or FIG. 12, the plurality of filter circuits include a first filter circuit 111 and a second filter circuit 112. The second port 2 of the first filter circuit 111 is connected to the first port 1 of the second filter circuit 112. Among them, the parallel node N connected to the parallel branch 24 in the first filter circuit 111 is a third parallel node N3. The parallel node N connected to the parallel branch 24 in the second filter circuit 112 is a fourth parallel node N4. A series resonator S and/or a series impedance element 23 are connected between the third parallel node N3 and the fourth parallel node N4.

In some examples, the first filter circuit 111 includes one series branch 21 and one parallel branch 24, as shown in Panel a of FIG. 11. In the series branch 21, a series resonance circuit 22 and a series impedance element 23 are successively connected in series between a first port 1 and a second port 2, the series resonance circuit 22 includes one series resonator $S_{11}$, and the series impedance element 23 includes one inductor $L_1$. In the parallel branch 24, a parallel resonance circuit 25 and a parallel impedance element 26 are successively connected in series between the parallel node N and the ground potential GND. The parallel node N is located between the series resonance circuit 22 and the first port 1. The parallel resonance circuit 25 includes one parallel resonator $P_{11}$, and the parallel impedance element 26 includes one capacitor $C_1$.

As shown in Panel b of FIG. 11, the second filter circuit 112 includes one series branch 21 and two parallel branches 24. The two parallel branches 24 are respectively a first parallel branch 241 and a second parallel branch 242. A parallel node N connected to the first parallel branch 241 is a first parallel node N1, and a parallel node N connected to the second parallel branch 242 is a second parallel node N2. In the series branch 21, the series resonator $S_{12}$ and the inductor $L_2$ are successively connected in series between the first port 1 and the second port 2. The first parallel node N1 is located between the series resonator $S_{11}$ and the first port 1, and the second parallel node N2 is located between the inductor $L_2$ and the second port 2. In the first parallel branch 241, the parallel resonator $P_{12}$ and the capacitor $C_2$ are successively connected in series between the first parallel node N1 and the ground potential GND. In the second parallel branch 242, the parallel resonator $P_{12}$ and the capacitor $C_3$ are successively connected in series between the second parallel node N2 and the ground potential GND. The second filter circuit 112 further includes an inductor $L_3$ connected between the first port 1 and the second port 2.

As shown in FIG. 11, the second port 2 of the first filter circuit 111 shown in Panel a is connected to the first port 1 of the second filter circuit 112 shown in Panel b to obtain the filter shown in Panel c.

As shown in FIG. 11, the first filter circuit 111 includes one parallel branch 24 to which a parallel node N, i.e., a third parallel node N3, is connected. The second filter circuit 112 includes two parallel branches 24. The fourth parallel node N4 may be a first parallel node N1 or a second parallel node N2.

When the fourth parallel node N4 is the first parallel node N1, a series resonator St and an inductor $L_1$ are connected between the third parallel node N3 and the fourth parallel node N4. When the fourth parallel node N4 is the second parallel node N2, a series resonator $S_{11}$, an inductor $L_1$, a series resonator $S_{12}$, and an inductor $L_2$ are connected between the third parallel node N3 and the fourth parallel node N4.

In this example, the inductor $L_1$ may have an inductance value of 1 nH-3.5 nH. The inductor $L_2$ may have an inductance value of 0.5 nH-2.5 nH. The inductor $L_2$ may have an inductance value of 5 nH-7 nH. The capacitor $C_1$ may have a capacitance value of 1.5 pF-3 pF. The capacitor $C_2$ may have a capacitance value of 3.5 pF-6 pF. The capacitor $C_3$ may have a capacitance value of 1.5 pF-4.5 pF.

In other examples, as shown in Panel a of FIG. 12, the first filter circuit 111 includes one series branch 21 and two parallel branches 24. The two parallel branches 24 are a first parallel branch 241 and a second parallel branch 242 respectively. A parallel node N connected to the first parallel branch 241 is a first parallel node N1, and a parallel node N connected to the second parallel branch 242 is a second parallel node N2. In the series branch 21, the series resonator $S_{11}$ and the inductor $L_1$ are successively connected in series between the first port 1 and the second port 2. The first parallel node N1 is located between the series resonator $S_{11}$ and the first port 1, and the second parallel node N2 is located between the inductor $L_1$ and the second port 2. In the first parallel branch 241, the parallel resonator $P_{11}$ and the capacitor $C_1$ are successively connected in series between the first parallel node N1 and the ground potential GND. In the second parallel branch 242, the parallel resonator $P_{12}$ and the capacitor $C_2$ are successively connected in series between the second parallel node N2 and the ground potential GND.

As shown in Panel b of FIG. 12, the second filter circuit 112 includes one series branch 21 and one parallel branch 24. In the series branch 21, two series resonators $S_{12}$ and $S_{13}$ and an inductor $L_2$ are successively connected in series between the first port 1 and the second port 2. In the parallel branch 24, a parallel resonator $P_{13}$ and a capacitor $C_3$ are successively connected in series between the parallel node N and the ground potential GND.

As shown in FIG. 12, the second port 2 of the first filter circuit 111 shown in Panel a is connected to the first port 1 of the second filter circuit 112 shown in Panel b to obtain the filter shown in Panel c.

As shown in FIG. 12, the first filter circuit 111 includes two parallel branches 24, and the third parallel node N3 may be the first parallel node N1 or the second parallel node N2. The second filter circuit 112 includes a parallel branch 24 to which a parallel node N, i.e., a fourth parallel node N4, is connected.

When the third parallel node N3 is the first parallel node N1, a series resonator $S_{11}$, an inductor $L_1$, a series resonator $S_{12}$, a series resonator $S_{13}$, and an inductor $L_2$ are connected between the third parallel node N3 and the fourth parallel node N4. When the third parallel node N3 is the second parallel node N2, a series resonator $S_{12}$, a series resonator $S_{13}$ and an inductor $L_2$ are connected between the third parallel node N3 and the fourth parallel node N4.

In this example, the inductor $L_1$ may have an inductance value of 0.5 nH-2.5 nH. The inductor $L_2$ may have an inductance value of 1.5 nH-3 nH. The capacitor $C_1$ may have a capacitance value of 1.5 pF-3 pF. The capacitor $C_2$ may have a capacitance value of 1 pF-3 pF. The capacitor $C_3$ may have a capacitance value of 4 pF-6 pF.

To form a single stop-band filter, in some embodiments, the series resonator S in the first filter circuit 111 has the same resonance frequency as the series resonator S in the second filter circuit 112. The parallel resonator P in the first filter circuit 111 has the same resonance frequency as the parallel resonator P in the second filter circuit 112. A single stop-band filter formed by two filter circuits connected in series may further reduce the pass-band loss coefficient and optimize the roll-off coefficient compared with one filter circuit.

As shown in FIG. 11, Panel d shows the S-parameter diagram of the filter shown in Panel c, and the corresponding parameter settings are as follows. The resonance frequencies of the series resonator $S_{11}$ in the first filter circuit 111 and the series resonator $S_{12}$ in the second filter circuit 112 are both 3.44 GHz. The resonance frequencies of the parallel resonator $P_{11}$ in the first filter circuit 111 and the parallel resonators $P_{12}$ and $P_{13}$ in the second filter circuit 112 are both 3.55 GHz. The inductors $L_1$, $L_2$, and $L_3$ have inductance values of 2.2 nH, 1.4 nH, and 6 nH, respectively, and the capacitors $C_1$, $C_2$, and $C_3$ have capacitance values of 2.2 pF, 4.5 pF, and 2.9 pF, respectively.

To form a double stop-band filter, in some embodiments, the resonance frequency of the series resonator S in the first filter circuit 111 is greater than the resonance frequency of the series resonator S in the second filter circuit 112. The first filter circuit 111 forms a high stop band and the second filter circuit 112 forms a low stop band.

To form a double stop-band filter, in some embodiments, the resonance frequency of the series resonator S in the first filter circuit 111 is less than the resonance frequency of the series resonator S in the second filter circuit 112. The first filter circuit 111 forms a low stop band and the second filter circuit 112 forms a high stop band.

As shown in FIG. 12, Panel d shows the S parameter diagram of the filter shown in Panel c, and the corresponding parameter settings are as follows. All the resonance frequencies of the series resonators $S_{11}$ in the first filter circuit 111 are 3.44 GHz, and all the resonance frequencies of the parallel resonators $P_{11}$ and $P_{12}$ in the first filter circuit 111 are 3.55 GHz. The resonance frequencies of the series resonators $S_{12}$ and $S_{13}$ in the second filter circuit 112 are both 4.49 GHz, and the resonance frequency of the parallel resonator $P_{13}$ in the second filter circuit 112 is 4.625 GHz. The inductors $L_1$ and $L_2$ have inductance values of 1.2 nH and 2.2 nH, and the capacitors $C_1$, $C_2$, and $C_3$ have capacitance values of 2.2 pF, 1.8 pF, and 5.1 pF. It can be seen that the filter shown in Panel c forms a low stop band at 3.55 GHz and a high stop band at 4.62 GHz.

The present disclosure provides a communication device including a filter as provided in any of the embodiments.

It will be appreciated by those skilled in the art that the present disclosure provides a communication device having the advantages of the filters described above.

The communication device provided by the present disclosure may be any product or component with communication functions such as a mobile phone, a telephone watch and a vehicle-mounted communication device.

For example, the filter may be a band-stop filter or notch filter, and may be applied in communication devices such as cell phones or smart phones, for example for suppressing dedicated frequency bands to protect low noise amplifiers, for suppressing harmonics in carrier aggregation systems to allow proper signal reception, or for other functions requiring suppression of specific frequencies or narrow frequency ranges.

In the present disclosure, "multiple" means two or more, and "at least one" means one or more, unless otherwise specified.

In the present disclosure, the terms "up", "down", etc. indicate orientation or positional relationships based on the orientation or positional relationships shown in the accompanying drawings, only for the convenience of describing and simplifying the description of the present disclosure, and not to indicate or imply that the device or component referred to must have a specific orientation, be constructed and operated in a specific orientation, and therefore cannot be understood as a limitation of the present disclosure.

In the specification, the terms "comprising", "including", or any other variation thereof are intended to encompass non-exclusive inclusion, such that a process, method, product, or equipment that includes a series of elements not only includes those elements, but also includes other elements not explicitly listed, or also includes elements inherent to such process, method, product, or equipment. Without further limitations, the elements limited by the statement "including one . . . " do not exclude the existence of other identical elements in the process, method, commodity, or device that includes the said elements.

The terms "one embodiment", "some embodiments", "exemplary embodiments", "one or more embodiments", "examples", "one example", "some examples", etc. referred to in the specification are intended to indicate that specific features, structures, materials, or characteristics related to the embodiment or example are included in at least one embodiment or example. The schematic representation of the above terms may not necessarily refer to the same embodiment or example. Furthermore, the specific features, structures, materials, or features described may be included in any one or more embodiments or examples in any appropriate manner.

In the specification, relational terms such as first and second are only used to distinguish one entity or operation from another entity or operation, without necessarily requiring or implying any such actual relationship or order between these entities or operations.

When describing some embodiments, the expressions "coupled" and "connected" may be used. For example, when describing some embodiments, the term "connection" may be used to indicate direct physical or electrical contact between two or more components. For example, when describing some embodiments, the term "coupled" may be used to indicate direct physical or electrical contact between two or more components. However, the terms "coupled" or "communicatively coupled" may also refer to two or more components that do not have direct contact with each other but still cooperate or interact with each other. The embodiments of the present disclosure are not necessarily limited to the content of the specification.

"At least one of A, B, and C" has the same meaning as "at least one of A, B, or C" and includes the following combinations of A, B, and C: only A, only B, only C, a combination of A and B, a combination of A and C, a combination of B and C, and a combination of A, B, and C.

"A and/or B" includes the following three combinations: only A, only B, and a combination of A and B.

As used in the specification, the term "if" is optionally interpreted as meaning "when" or "at" or "in response to determination" or "in response to detection" depending on the context. Similarly, depending on the context, the phrases "if determined . . . " or "if detected [stated condition or event]" are optionally interpreted as referring to "when determined . . . " or "in response to determined . . . " or "when detected [stated condition or event]" or "in response to detected [stated condition or event]".

The use of "used" or "configured as" in the specification implies an open and inclusive language, which does not exclude devices that are applicable or configured to perform additional tasks or steps.

The use of "based on" or "according to" in the specification implies openness and inclusiveness. A process, step, calculation, or other action based on one or more of the conditions or values may be based on other conditions or exceed the values in practice. In practice, a process, step, calculation, or other action based on one or more of the conditions or values may be based on other conditions or exceed the values.

As used in the specification, "about", "roughly", or "approximately" includes the value described and the average value within an acceptable deviation range of a specific value, where the acceptable deviation range is determined by persons skilled in the art taking into account the measurement being discussed and the errors associated with a specific amount of measurement (i.e., limitations of the measurement system).

As used in the specification, "parallel", "vertical", "equal", and "flush" include the described situation and situations that are similar to the described situation. The range of such similar situations is within the acceptable deviation range, where the acceptable deviation range is determined by persons skilled in the art taking into account the measurement being discussed and the errors related to a specific amount of measurement (i.e., the limitations of the measurement system). For example, "parallel" includes absolute parallel and approximate parallel, where the acceptable deviation range for approximate parallel can be within 5°; "vertical" includes absolute vertical and approximate vertical, where the acceptable deviation range for approximate vertical can also be within 5°. "Equality" includes absolute equality and approximate equality, where the acceptable range of approximately equal deviations, for example, can be that the difference between the equal two is less than or equal to 5% of either one. "Flush" includes absolute flush and approximate flush, where the acceptable deviation range for approximate flush, for example, can be that the distance between the equal two is less than or equal to 5% of the size of either one.

It should be understood that when a layer or component is referred to as being on another layer or substrate, it can be that the layer or component is directly on another layer or substrate, or there can be an intermediate layer between the layer or component and another layer or substrate.

The specification describes exemplary embodiments with reference to sectional and/or floor plans as idealized exemplary drawings. In the attached figure, for clarity, the thickness of the layers and regions has been enlarged. Therefore, it can be assumed that changes in shape relative to the drawings may occur due to factors such as manufacturing technology and/or tolerances. Therefore, exemplary embodiments should not be interpreted as limited to the shape of the area shown herein, but rather include shape deviations caused by, for example, manufacturing. For example, the etched area shown as a rectangle will typically have curved features. Therefore, the areas shown in the drawings are essentially illustrative, and their shapes are not intended to show the actual shape of the area of the device, nor are they intended to limit the scope of exemplary embodiments.

Finally, it should be noted that the above embodiments are only used to illustrate the technical solution of the present disclosure, and not to limit it. Although detailed explanations of the present disclosure have been provided with reference to the aforementioned embodiments, those skilled in the art should understand that they can still modify the technical solutions recorded in the aforementioned embodiments, or equivalently replace some of the technical features therein. And these modifications or replacements do not make the essence of the corresponding technical solutions deviate from the spirit and scope of the technical solutions of the embodiments of the present disclosure.

The invention claimed is:

1. A filter circuit, comprising:
   a series branch connected between a first port and a second port, and comprising a series resonance circuit and a series impedance element connected in series with each other, wherein the series resonance circuit comprises a series resonator;

a parallel branch connected between a parallel node and a ground potential, and comprising a parallel resonance circuit and a parallel impedance element connected in series with each other, wherein the parallel resonance circuit comprises a parallel resonator, and the parallel node is located on a connection path of the first port and the second port; and a voltage dividing impedance element connected in parallel with at least one series resonator, or connected in parallel with the at least one series resonator and the series impedance element, wherein a resonance frequency of the series resonator is less than a resonance frequency of the parallel resonator.

2. The filter circuit according to claim 1, wherein the series resonance circuit comprises a plurality of series resonators connected in series with each other; and the series resonators are connected between the series impedance element and the first port and/or between the series impedance element and the second port.

3. The filter circuit according to claim 2, wherein the resonance frequencies of the plurality of series resonators are the same.

4. The filter circuit according to claim 1, wherein the parallel resonance circuit comprises a plurality of parallel resonators connected in parallel with each other; and the plurality of parallel resonators are connected between the parallel impedance element and the parallel node or between the parallel impedance element and the ground potential.

5. The filter circuit according to claim 4, wherein the resonance frequencies of the plurality of parallel resonators are the same.

6. The filter circuit according to claim 1, wherein the filter circuit comprises a plurality of the parallel branches, and the resonance frequencies of the parallel resonators in the plurality of the parallel branches are all the same.

7. The filter circuit according to claim 6, wherein the plurality of the parallel branches comprise a first parallel branch and a second parallel branch, a parallel node connected to the first parallel branch is a first parallel node, and a parallel node connected to the second parallel branch is a second parallel node;

wherein the series resonator and/or the series impedance element are connected between the first parallel node and the second parallel node.

8. The filter circuit according to claim 7, wherein the parallel impedance element in the first parallel branch and the parallel impedance element in the second parallel branch are capacitors with different capacitance values or inductors with different inductance values.

9. The filter circuit according to claim 1, wherein the voltage dividing impedance element and the series impedance element are both inductors, and an inductance value of the voltage dividing impedance element is greater than an inductance value of the series impedance element; or the voltage dividing impedance element and the series impedance element are both capacitors, and a capacitance value of the voltage dividing impedance element is greater than a capacitance value of the series impedance element.

10. The filter circuit according to claim 1, wherein the difference between the resonance frequency of the parallel resonator and the resonance frequency of the series resonator is greater than or equal to 0.1 GHz and less than or equal to 0.3 GHZ.

11. The filter circuit according to claim 1, wherein the parallel resonator and the series resonator are elastic wave resonators of the same type, and the types of the elastic wave resonators comprise a surface acoustic wave resonator and a bulk acoustic wave resonator.

12. The filter circuit according to claim 1, wherein the series impedance element comprises at least one of an adjustable capacitor, an adjustable inductor, a non-adjustable capacitor, and a non-adjustable inductor; and the parallel impedance element comprises at least one of an adjustable capacitor, an adjustable inductor, a non-adjustable capacitor, and a non-adjustable inductor.

13. The filter circuit according to claim 1, wherein the series impedance element comprises an inductor having an inductance value greater than or equal to 0.5 nH and less than or equal to 3.5 nH.

14. The filter circuit according to claim 1, wherein the parallel impedance element comprises a capacitor having a capacitance value greater than or equal to 0.5 pF and less than or equal to 7 pF.

15. A filter, comprising one or more filter circuits according to claim 1, wherein a plurality of the filter circuits comprise a first filter circuit and a second filter circuit, and a second port of the first filter circuit is connected to a first port of the second filter circuit.

16. The filter according to claim 15, wherein a parallel node connected to a parallel branch in the first filter circuit is a third parallel node, a parallel node connected to a parallel branch in the second filter circuit is a fourth parallel node, and the series resonator and/or the series impedance element are connected between the third parallel node and the fourth parallel node.

17. The filter according to claim 16, wherein the resonance frequency of the series resonator in the first filter circuit and the resonance frequency of the series resonator in the second filter circuit are the same, and the resonance frequency of the parallel resonator in the first filter circuit and the resonance frequency of the parallel resonator in the second filter circuit are the same.

18. The filter according to claim 16, wherein the resonance frequency of the series resonator in the first filter circuit is greater than the resonance frequency of the series resonator in the second filter circuit; or the resonance frequency of the series resonator in the first filter circuit is less than the resonance frequency of the series resonator in the second filter circuit.

19. A communication device, comprising an amplifier and the filter according to claim 15.

* * * * *